(12) United States Patent
Brammer et al.

(10) Patent No.: US 11,826,713 B2
(45) Date of Patent: Nov. 28, 2023

(54) SYSTEMS AND METHODS FOR GENERATING A CONDUCTIVE LIQUID COMPRISING DEIONIZED WATER WITH AMMONIA GAS DISSOLVED THEREIN

(71) Applicant: MKS Instruments, Inc., Andover, MA (US)

(72) Inventors: Ulrich Alfred Brammer, Berlin (DE); Johannes Seiwert, Berlin (DE); Christiane Le Tiec, Berlin (DE)

(73) Assignee: MKS Instruments, Inc., Andover, MA (US)

( * ) Notice: Subject to any disclaimer, the term of this patent is extended or adjusted under 35 U.S.C. 154(b) by 70 days.

(21) Appl. No.: 17/005,560

(22) Filed: Aug. 28, 2020

(65) Prior Publication Data

US 2020/0391163 A1    Dec. 17, 2020

Related U.S. Application Data

(63) Continuation of application No. 15/808,471, filed on Nov. 9, 2017, now Pat. No. 10,773,221.
(Continued)

(51) Int. Cl.
*B01F 3/04* (2006.01)
*B01F 23/00* (2022.01)
(Continued)

(52) U.S. Cl.
CPC .............. *B01F 23/09* (2022.01); *B01F 23/19* (2022.01); *B01F 23/2322* (2022.01);
(Continued)

(58) Field of Classification Search
CPC ...... B01F 23/09; B01F 23/2322; B01F 23/29; B01F 23/19; B01F 23/2376; B01F 25/31;
(Continued)

(56) References Cited

U.S. PATENT DOCUMENTS 5,415,191 A    5/1995  Mashimo et al.
5,472,516 A   12/1995  Hanson et al.
(Continued)

FOREIGN PATENT DOCUMENTS

CN    101059465 A    10/2007
CN      1898776 B     4/2011
(Continued)

OTHER PUBLICATIONS

Partial English Translation of JP 2002-292362 A (Year: 2002).*

*Primary Examiner* — Charles S Bushey
(74) *Attorney, Agent, or Firm* — Cesari and McKenna, LLP

(57) ABSTRACT

Systems and methods are described for dissolving ammonia gas in deionized water. The system includes a deionized water source and a gas mixing device including a first inlet for receiving ammonia gas, a second inlet for receiving a transfer gas, and a mixed gas outlet for outputting a gas mixture including the ammonia gas and the transfer gas. The system includes a contactor that receives the deionized water and the gas mixture and generates deionized water having ammonia gas dissolved therein. The system includes a sensor in fluid communication with at least one inlet of the contactor for measuring a flow rate of the deionized water, and a controller in communication with the sensor. The controller sets a flow rate of the ammonia gas based on the flow rate of the deionized water measured by the sensor, and a predetermined conductivity set point.

23 Claims, 9 Drawing Sheets

Related U.S. Application Data

(60) Provisional application No. 62/420,953, filed on Nov. 11, 2016.

(51) Int. Cl.

| | | |
|---|---|---|
| *G05D 11/13* | (2006.01) | |
| *B01F 23/10* | (2022.01) | |
| *B01F 23/20* | (2022.01) | |
| *B01F 23/232* | (2022.01) | |
| *B01F 25/31* | (2022.01) | |
| *B01F 25/42* | (2022.01) | |
| *B01F 35/21* | (2022.01) | |
| *B01F 35/22* | (2022.01) | |
| *B01F 35/221* | (2022.01) | |
| *C11D 7/04* | (2006.01) | |
| *B01F 23/237* | (2022.01) | |
| *B01F 101/48* | (2022.01) | |
| *B01F 101/58* | (2022.01) | |
| *B01F 101/00* | (2022.01) | |
| *B08B 3/08* | (2006.01) | |
| *H01L 21/67* | (2006.01) | |

(52) U.S. Cl.
CPC ............ *B01F 23/29* (2022.01); *B01F 25/31* (2022.01); *B01F 25/42* (2022.01); *B01F 35/2112* (2022.01); *B01F 35/2113* (2022.01); *B01F 35/2115* (2022.01); *B01F 35/2132* (2022.01); *B01F 35/21112* (2022.01); *B01F 35/2202* (2022.01); *B01F 35/2211* (2022.01); *B01F 35/2213* (2022.01); *B01F 35/2217* (2022.01); *C11D 7/04* (2013.01); *G05D 11/131* (2013.01); *B01F 23/2376* (2022.01); *B01F 2101/4505* (2022.01); *B01F 2101/48* (2022.01); *B01F 2101/58* (2022.01); *B08B 3/08* (2013.01); *H01L 21/6704* (2013.01)

(58) Field of Classification Search
CPC  B01F 25/42; B01F 35/2213; B01F 35/21112; B01F 35/2113; B01F 35/2211; B01F 35/2202; B01F 35/2112; B01F 35/2132; B01F 35/2115; B08B 3/08; C11D 7/04; G05D 11/131; H01L 21/6704
USPC ...................... 261/20, 26, 64.1, 66
See application file for complete search history.

(56) References Cited

U.S. PATENT DOCUMENTS

| | | | |
|---|---|---|---|
| 5,674,410 A | 10/1997 | Nakajima et al. | |
| 6,001,223 A | 12/1999 | Hoffman et al. | |
| 6,158,721 A | 12/2000 | Katou et al. | |
| 6,350,425 B2 * | 2/2002 | Hoffman | C01C 1/024 423/470 |
| 6,884,359 B2 | 4/2005 | Kambe et al. | |
| 7,147,827 B1 | 12/2006 | Balisky | |
| 7,731,161 B2 | 6/2010 | Seiwert et al. | |
| 8,448,925 B2 | 5/2013 | Seiwert et al. | |
| 8,727,323 B2 | 5/2014 | Seiwart et al. | |
| 8,844,909 B2 | 9/2014 | Xia et al. | |
| 10,773,221 B2 * | 9/2020 | Brammer | B01F 25/42 |
| 2002/0011253 A1 | 1/2002 | Puri et al. | |
| 2002/0063345 A1 | 5/2002 | Toshio et al. | |
| 2002/0079478 A1 * | 6/2002 | Hoffman | C01C 1/024 422/600 |
| 2002/0081237 A1 | 6/2002 | Hoffman et al. | |
| 2005/0093182 A1 | 5/2005 | Morita et al. | |
| 2008/0257738 A1 | 10/2008 | Seiwert et al. | |
| 2011/0134716 A1 | 6/2011 | Seiwert et al. | |
| 2011/0256030 A1 * | 10/2011 | Barthel | B01J 19/26 422/129 |
| 2014/0357734 A1 | 12/2014 | Xia et al. | |
| 2016/0064257 A1 | 3/2016 | Nonaka et al. | |

FOREIGN PATENT DOCUMENTS

| | | | |
|---|---|---|---|
| CN | 102031484 A | | 4/2011 |
| CN | 104056551 A | | 9/2014 |
| CN | 102986008 B | | 8/2015 |
| CN | 102933277 B | | 9/2015 |
| CN | 105036284 A | | 11/2015 |
| EP | 1512457 A1 | | 3/2005 |
| JP | 2000354729 A | | 12/2000 |
| JP | 2002172318 A | | 6/2002 |
| JP | 2002-292362 A | * | 10/2002 |
| JP | 2003010660 A | | 1/2003 |
| JP | 2004273799 A | | 9/2004 |
| JP | 2005139048 A | | 6/2005 |
| JP | 2013528949 A | | 7/2013 |
| JP | 2016076589 A | | 5/2016 |
| KR | 20020025047 A | | 4/2002 |
| TW | 200616074 A | | 5/2006 |
| TW | 293190 B | | 2/2008 |
| TW | 201619065 A | | 6/2016 |

* cited by examiner

700

705 supply ammonia gas to a first inlet of a gas mixing device 710 supply a transfer gas to a second inlet of the gas mixing device 715 supply a gas mixture comprising the ammonia gas and the transfer gas from the gas mixing device and deionized water to a contactor 720 measure a flow rate of the deionized water 725 set a flow rate of the ammonia gas based on the flow rate of the deionized water and a predetermined conductivity set point 730 flow the deionized water having ammonia gas dissolved therein from the contactor

FIG. 7

SYSTEMS AND METHODS FOR GENERATING A CONDUCTIVE LIQUID COMPRISING DEIONIZED WATER WITH AMMONIA GAS DISSOLVED THEREIN

CROSS-REFERENCE TO RELATED APPLICATION

This application is a continuation of U.S. Ser. No. 15/808,471, filed Nov. 9, 2017, now issued as U.S. Pat. No. 10,773,221, which claims the benefit of U.S. Provisional Application No. 62/420,953, filed Nov. 11, 2016. These applications are owned by the assignee of the instant application and each of them is incorporated by reference herein in its entirety.

TECHNICAL FIELD

This application relates generally to systems and methods employed in wet cleaning operations during fabrication of semiconductor devices. In particular, this application relates to systems and methods for generating and delivering deionized water with a desired concentration of $NH_3$ for use in semiconductor fabrication processes.

BACKGROUND

Deionized water ("DI-water") and ultra pure water (used interchangeably herein) are commonly used in semiconductor device fabrication processes for rinsing or wet cleaning operations. However, use of a substantially non-conductive liquid such as DI-water in semiconductor fabrication processes can contribute to a buildup of charge on the surface of the wafer. This is especially a problem in fabrication processes utilizing spinning wafer tools, as electroosmotic effects produced by the contact between the wafer and the DI water used for cleaning operations can lead to charge buildup and eventual electrostatic discharge events. These discharge events can damage or even destroy structures on the wafer, or cause contaminants or undesirable particles to attach to the wafer.

Existing systems have sought to reduce charge buildup on the wafer during wet cleaning operations through the use of a conductive cleaning liquid. For example, a gas such as carbon dioxide ($CO_2$) can be dissolved in the DI-water to produce carbonated deionized ("DI-$CO_2$") water.

Rinsing with conductive DI-$CO_2$ water can avoid charge buildup on the wafer surface and allow for substantially damage-free cleaning while maintaining device integrity. $CO_2$ has the further advantage of leaving substantially no solid residue as a result of evaporation, which is important in semiconductor processing. However, DI-$CO_2$ water is acidic enough that it can undesirably etch away acid-sensitive materials such as copper and cobalt which are commonly used in the back end of line ("BEOL") stage of wafer fabrication.

Another approach uses ammonia ("$NH_3$") instead of $CO_2$. By dissolving $NH_3$ in DI-water, an alkaline solution with substantially lower etch rates than DI-$CO_2$ can be produced for use in wet cleaning operations.

$NH_3$ can be supplied as a concentrated solution or as a gas. Due to the high solubility of $NH_3$ in DI-water, use of $NH_3$ in its gas phase results in a total absorption of the $NH_3$ into the DI-water. However, $NH_3$ gas is so reactive with DI-water that there is a high risk the DI-water will flow back into the $NH_3$ gas supply line and into the $NH_3$ valves when the flow rate of $NH_3$ is sufficiently low. This can lead to serious control problems, as the flow characteristics of a valve are vastly different between a gas-filled valve and the same valve filled with water. It is therefore difficult to maintain a stable flow of $NH_3$ gas into DI-water under such conditions, especially when the gas flow has to be interrupted from time to time in the normal course of the fabrication process.

Some systems have sought to avoid the challenges associated with precisely controlling the flow rate of $NH_3$ gas by instead using a hollow-fiber membrane system to dissolve gas that is supplied at a substantially constant flow rate into DI-water having varying flow rates (e.g., between 1 L/min and 10 L/min). While these systems can deliver a liquid with stable conductivity under certain conditions, they do so by maintaining a 90% or higher saturation of the liquid, requiring that excess $NH_3$ and other gases are supplied to the membrane system. This is not only an economic disadvantage, but also requires additional effort in the treatment of the undissolved off gas leaving the system and increases the risk in contamination of the ambient air with $NH_3$.

For example, $NH_3$ is a toxic gas and therefore special care is needed to avoid contamination of ambient air. The requirements for semiconductor fabrication are typically more restrictive regarding release of $NH_3$ into the ambient air, as even $NH_3$ concentrations well below typical environmental and health threshold limits can interfere with certain semiconductor manufacturing and processing steps.

Another approach is to avoid using $NH_3$ gas altogether, and to instead dilute a concentrated $NH_3$ solution into the DI-water. However, this approach requires a very high dilution rate that can be a factor 1000 and more. Further, accurately mixing such a small quantity of a liquid into another liquid is challenging due to the limited mixing time provided. Often, the limited mixing time results in fluctuations in the concentration of the $NH_3$ in the liquid at the outlet to the system. This can be overcome by maintaining a constant flow rate between the $NH_3$ solution and the DI-water. However, maintaining a constant flow rate is not preferable because of the high amount of liquid that is discharged at times when less liquid is needed for a particular operation. Utilizing a constant flow rate results in a large amount of wasted liquid discharge, and therefore substantially increases operating costs.

In addition, a concentrated aqueous $NH_3$ solution absorbs $CO_2$ from ambient air upon contact. $CO_2$ can also permeate through the walls of the container or tank used to store the aqueous $NH_3$ solution. This can lead to an increased carbonate content of the liquid over time, especially in systems that recycle a part of the supplied $NH_3$ solution. The carbonate content can interfere with the process control, as the relation between the pH and the conductivity of an $NH_3$ solution changes based on the carbonate content. Accordingly, systems based on the dissolution of aqueous $NH_3$ require additional processing steps and components such as ion exchangers to remove the carbonate and other impurities from the supplied liquid.

Control of the concentration of the $NH_3$ in the DI-water, or relatedly, control of the conductivity, at the dynamically changing DI-water flow rates that are typically required for single wafer applications is difficult. Typically, different conductivity set points are also requested and may take a long time to stabilize causing decreased throughput and therefore a higher cost of ownership. Further, due to a quadratic component between $NH_3$ concentration and conductivity, a much wider range is needed for the $NH_3$ flow than for the DI-water flow.

Precise steady state concentration for a constant flow can theoretically be achieved using a feedback control to eliminate all differences over time. However, accurate control of concentration is much more complicated for dynamically-changing flows of the cleaning liquid, as real systems cannot be built with a zero volume that would behave in an ideal manner. A real system has a certain volume that acts as a buffer volume during flow changes. Concentration changes are therefore often delayed, which leads to under dosage or concentration overshoot at changing flow rates, which influences conductivity. Such a behavior is unwanted and needs to be restricted to small variations in conductivity in order to maintain process stability at all conditions, and in order for each processing chamber to operate under the same conditions.

SUMMARY

There is therefore a need for systems and methods for generating and delivering a conductive cleaning liquid comprising DI-water with a desired concentration of $NH_3$ dissolved therein to prevent charge buildup on a wafer surface when used for semiconductor fabrication processes such as wet cleaning operations. The technology described herein allows for precise control over the $NH_3$ concentration of the resulting liquid even with dynamically-changing flow rate and desired conductivity demands during wet cleaning and other semiconductor fabrication operations. Further, the concepts described herein provide a conductive solution having an $NH_3$ concentration that results in an alkaline solution with etch rates that are compatible with emerging semiconductor fabrication processes for treatment of advanced transistor structures.

The technology, in one aspect, features a system for dissolving ammonia gas in deionized water. The system includes a deionized water source. The system further includes a gas mixing device that includes a first inlet in fluid communication with a first gas source for supplying ammonia gas, a second inlet in fluid communication with a second gas source for supplying a transfer gas, and a mixed gas outlet for outputting a gas mixture including the ammonia gas and the transfer gas. The system further includes a contactor in fluid communication with the deionized water source and the mixed gas outlet via at least one inlet of the contactor. The contactor generates deionized water having ammonia gas dissolved therein. The system further includes a sensor in fluid communication with the at least one inlet of the contactor for measuring a flow rate of the deionized water. The system further includes a controller in communication with the sensor. The controller is configured to set a flow rate of the ammonia gas supplied from the first gas source based on the flow rate of the deionized water measured by the sensor, and a predetermined conductivity set point.

The technology can further include any of the following features. In some embodiments, the mixed gas outlet is in fluid communication with the deionized water source upstream of the at least one inlet of the contactor.

In some embodiments, a static mixing device is positioned upstream of the at least one inlet of the contactor. The static mixing device is for mixing the gas mixture output from the gas mixing device with deionized water output from the deionized water source.

In some embodiments, the contactor is a packed column or packed tower type contactor. In some embodiments, the at least one outlet of the contactor includes a gas outlet for expelling an off gas from the contactor, and a liquid outlet for outputting the deionized water having ammonia gas dissolved therein.

In some embodiments, the system further includes a fluid level sensor in fluid communication with the top and the bottom of the contactor. In some embodiments, the system further includes a pressure sensor in fluid communication with the contactor.

In some embodiments, the system further includes a temperature sensor in fluid communication with one of the at least one inlet of the contactor for measuring a temperature of the deionized water, and at least one outlet of the contactor for measuring a temperature of the deionized water having ammonia gas dissolved therein. In some embodiments, the controller is in communication with the temperature sensor, and the controller is further configured to set the flow rate of the ammonia gas supplied from the first gas source based on a temperature measured by the temperature sensor.

In some embodiments, the controller is further configured to adjust a pressure of the transfer gas output from the second gas source based on the flow rate of the deionized water measured by the sensor. In some embodiments, the gas mixing device further includes at least one flow control device in fluid communication with the first inlet of the gas mixing device. In some embodiments, the gas mixing device further includes a gas injector in communication with the second inlet, and the gas injector is positioned within the gas mixing device to direct a flow of the transfer gas to an opening of an outlet of the at least one flow control device of the gas mixing device.

In some embodiments, the system further includes a pump in fluid communication with the at least one liquid outlet of the contactor.

In some embodiments, the mixed gas outlet is in fluid communication with the deionized water source. In some embodiments, the at least one inlet of the contactor includes a liquid inlet in fluid communication with the deionized water source, and a gas inlet in fluid communication with the mixed gas outlet. In some embodiments, the gas inlet includes an exit orifice within the contactor that is positioned substantially at a mean level of a liquid in the contactor.

The technology, in another aspect, features a method for dissolving ammonia gas in deionized water. The method includes supplying ammonia gas to a first inlet of a gas mixing device, supplying a transfer gas to a second inlet of the gas mixing device, and supplying a gas mixture comprising the ammonia gas and the transfer gas from the gas mixing device and deionized water to a contactor. The method further includes measuring a flow rate of the deionized water and setting a flow rate of the ammonia gas based on the flow rate of the deionized water and a predetermined conductivity set point. The method further includes flowing the deionized water having ammonia gas dissolved therein from the contactor.

The technology can further include any of the following features. In some embodiments, the method further includes mixing the gas mixture output from the gas mixing device with the deionized water upstream of the contactor.

In some embodiments, the contactor is a packed column or packed tower type contactor. In some embodiments, the method further includes expelling an off gas from a gas outlet of the contactor, and flowing the deionized water having ammonia gas dissolved therein from a liquid outlet of the contactor. In some embodiments, the method further includes sensing a fluid level of fluid in the contactor.

In some embodiments, the method further includes sensing a fluid pressure of fluid in the contactor. In some embodiments, the method further includes sensing a temperature of at least one of the deionized water, and the deionized water having ammonia gas dissolved therein.

In some embodiments, the method further includes setting the flow rate of the ammonia gas to supply further based on the temperature. In some embodiments, the method further includes adjusting a pressure of the transfer gas based on the flow rate of the deionized water.

In some embodiments, the method further includes controlling a flow rate of the ammonia gas supplied to the gas mixing device with at least one flow control device. In some embodiments, the method further includes supplying the transfer gas further comprises directing a flow of the transfer gas within the gas mixing device to an opening of an outlet of the at least one flow control device of the gas mixing device.

In some embodiments of the method, flowing further includes pumping the deionized water having ammonia gas dissolved therein from the contactor via a liquid outlet of the contactor. In some embodiments, the method further includes supplying the gas mixture to the contactor further comprises supplying the gas mixture to a gas inlet of the contactor, wherein the gas inlet comprises an exit orifice within the contactor that is positioned substantially at a mean level of a liquid in the contactor.

BRIEF DESCRIPTION OF THE DRAWINGS

The advantages of the systems and methods described herein, together with further advantages, may be better understood by referring to the following description taken in conjunction with the accompanying drawings. The drawings are not necessarily to scale, emphasis instead generally being placed upon illustrating the principles of the described embodiments by way of example only.

FIG. 7 is a flow diagram of a method 700 for dissolving $NH_3$ gas in DI-water, according to embodiments of the technology described herein.

DETAILED DESCRIPTION

A conductive liquid comprising $NH_3$ gas dissolved in DI-water can be used in semiconductor device fabrication processes for rinsing or wet cleaning operations. For example, such a conductive liquid is commonly used in fabrication processes employing tools such as single wafer spin tools. Spin tools typically process a single wafer, one after another, in a chamber. Some higher throughput spin tools can include more than one chamber (e.g., 2O chambers) to increase throughput. However, the operations carried out in the individual chambers are typically not synchronized, resulting in a randomly-changing demand for the conductive rinsing agent. Accordingly, the source of the DI-water with $NH_3$ gas dissolved therein must be able to maintain a stable $NH_3$ concentration at dynamically-changing flow rates in order to maintain the desired conductivity of the rinsing agent.

Figure 1:
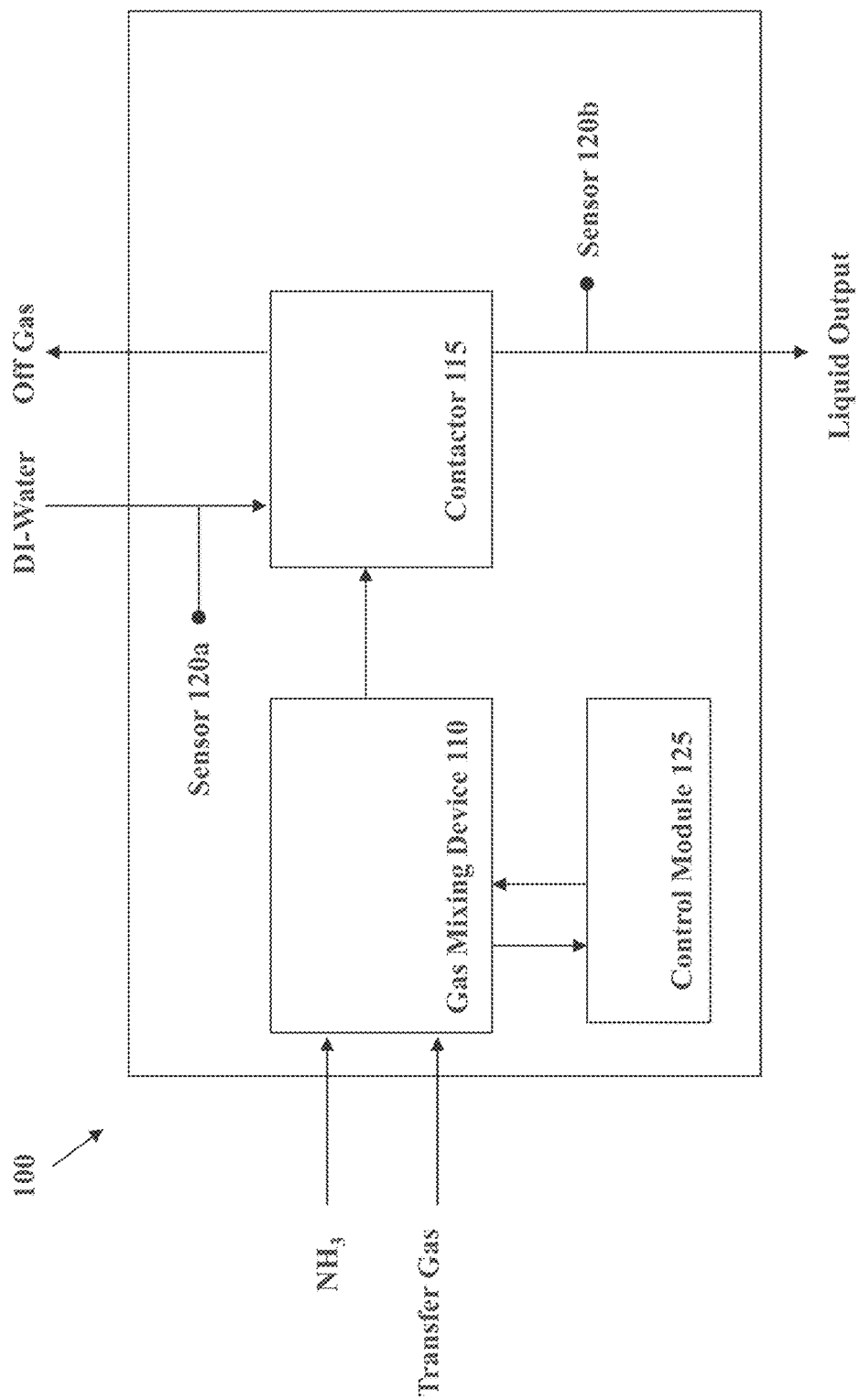
FIG. 1 is a block diagram of a first embodiment of a system for generating and delivering a conductive liquid comprising DI-water with $NH_3$ gas dissolved therein according to embodiments of the technology described herein.

FIG. 1 is a block diagram of a system 100 for generating and delivering a conductive liquid comprising DI-water having a desired concentration of $NH_3$ gas dissolved therein. System 100 includes gas mixing device 110, contactor 115, sensor 120a, and sensor 120b (collectively referred to as sensors 120). System 100 also includes a source of electrical power (not shown), and can include a control module 125.

Gas mixing device 110 can include one or more gas inlets, and can be connected to one or more sources of gas. In the example shown in FIG. 1, a first inlet of gas mixing device 110 is in fluid communication with a source of $NH_3$ gas, and a second inlet of gas mixing device 110 is in fluid communication with a source for supplying a transfer gas. In some embodiments, the transfer gas source provides nitrogen ($N_2$) gas. In some embodiments, the transfer gas source provides a noble gas (e.g., argon, helium).

Gas mixing device 110 can include a plurality of variable valves, on/off valves, filters and mass flow controllers to monitor and/or control the flow rate and amount of each gas entering and exiting gas mixing device 110. The gases can be mixed within gas mixing device 110 before exiting via an outlet. The gas mixture exiting gas mixing device 110 can be delivered to contactor 115.

Use of gas mixing device 110 to mix $NH_3$ gas with a transfer gas prior to mixing the $NH_3$ gas with DI-water in contactor 115 provides certain advantages. For example, mixing the $NH_3$ gas with a transfer gas having a low solubility in water, such as $N_2$, can prevent the DI-water from sucking back into the $NH_3$ supply, as the transfer gas acts to separate the DI-water from the $NH_3$ supply line and control valve. Further, $N_2$ does not create a flammable mixture when mixed with $NH_3$ gas, therefore avoiding safety concerns. Operation of gas mixing device 110 and additional advantages it provides for this technology are discussed in more detail below in reference to FIGS. 5 and 6.

Contactor 115 typically includes at least one inlet for receiving the gas mixture from gas mixing device 110, at least one inlet for receiving DI-water from a DI-water source, at least one outlet to release or vent excess gas (e.g., off gas), and at least one outlet to deliver the rinsing agent or conductive liquid output (e.g., DI-water with $NH_3$ gas dissolved therein). The gas mixture can be injected, or purged into the contactor 115. Contactor 115 can be pressurized or evacuated if desired. Contactor 115 typically allows for generation of bubble-free rinsing liquid.

System 100 can include sensors 120 for monitoring a plurality of parameters of the various inputs to system 100 as well as the conductive liquid output from contactor 115. In some embodiments, sensor 120a includes a flow meter for measuring a flow rate of the DI-water from the DI-water source, and sensor 120b includes a temperature sensor for measuring the temperature of the liquid output from contactor 115. In some examples, sensor 120b further includes a conductivity sensor for measuring the conductivity of the liquid output from contactor 115. In some embodiments, system 100 can include one or more other sensors for measuring a plurality of parameters of the gases and liquids at various stages within system 100. Such parameters can include flow rate, conductivity, temperature, and pressure.

Control module 125 can be in fluid and/or electrical communication with sensors 120 and gas mixing device 110. Control module 125 can include a processor, memory resources, a keypad and a display. The processor can be for example, a microprocessor of a computer. Control module 125 can allow automatic control and/or monitoring of each valve, mass flow controller and sensor in system 100. In some embodiments, each valve, mass flow controller and sensor in system 100 can be controlled manually.

In one embodiment, control module 125 can determine the required dosage of $NH_3$ gas to provide to gas mixing device 110, and subsequently to contactor 115, based upon a conductivity (Kappa) set point selected by a user. For example, when $NH_3$ is dissolved in water ($H_2O$), it dissociates resulting in the formation of an ammonium particle and a hydroxide particle according to the following reaction:

$$NH_3 + H_2O \leftrightarrow NH_4^+ + OH^- \quad \text{EQN. 1}$$

The dissociation is governed by the basic dissociation constant $K_b$ which is a function of the water temperature. The temperature dependence of $K_b$ has been characterized, and is a predetermined quantity that can be stored in control module 125. For the purposes of the calculations performed by control module 125, the concentration of $NH_4^+$ and $OH^-$ can be approximated as identical. The following formula provides the required concentration of $NH_3$ "$cNH_3$" based on the dissociation constant $K_b$ at the measured water temperature (e.g., the temperature measured by sensor 120b).

$$cNH_3 = (cNH_4^{+^2} + K_b(T) \cdot cNH_4^+)/K_b(T) \quad \text{EQN. 2}$$

The required flow of $NH_3$ gas can be calculated from the concentration $cNH_3$ and DI-water flow rate measured by sensor 120a:

$$F_{NH3} = F_{H2O} \cdot cNH_3 \quad \text{EQN. 3}$$

The $NH_4^+$ concentration and the $OH^-$ concentration result in a conductivity equal to Kappa based on the temperature dependent specific equivalent conductivities, $Lambda_{NH4}(T) + Lambda_{OH^-}(T)$. The temperature dependencies of the specific equivalent conductivities have been characterized, and are predetermined quantities that can be stored in control module 125. The controller is therefore able to calculate $Lambda_{NH4}(T) + Lambda_{OH^-}(T)$ from the measured temperature T of the liquid output from contactor 115. The controller calculates $cNH_4^+$ from the given conductivity set point Kappa from the following formula:

$$Kappa = (Lambda_{NH4}(T) + Lambda_{OH^-}(T)) \cdot cNH_4^+ \quad \text{EQN. 4}$$

Accordingly, control module 125 calculates the required $NH_3$ gas flow in a feed forward control loop, allowing system 100 to quickly react to changes in DI-water flow rates and provide a rinsing liquid having the required conductivity. For example, control module 125 can control one or more valves of system 100 to adjust the flow rate of the gases and/or DI-water. In some embodiments, the calculation includes a correction factor that is changed very slowly based on the resulting conductivity of the liquid measured by sensor 120b.

In some embodiments, control module 125 calculates the required flow rate or dosage of $NH_3$ gas to supply based on the measured temperature of the DI-water from the DI-water supply. In some embodiments, control module 125 calculates the required flow rate or dosage of $NH_3$ gas to supply based on the measured flow rate of the conductive fluid output from contactor 115. In some embodiments, the calculation of the required flow rate or dosage of $NH_3$ gas to supply can be based on predetermined assumptions about the temperature range of the liquid in the system without requiring an actual temperature measurement to be obtained. For example, the temperature value can be based on typical environmental conditions observed at semiconductor fabrication facilities.

Figure 2:
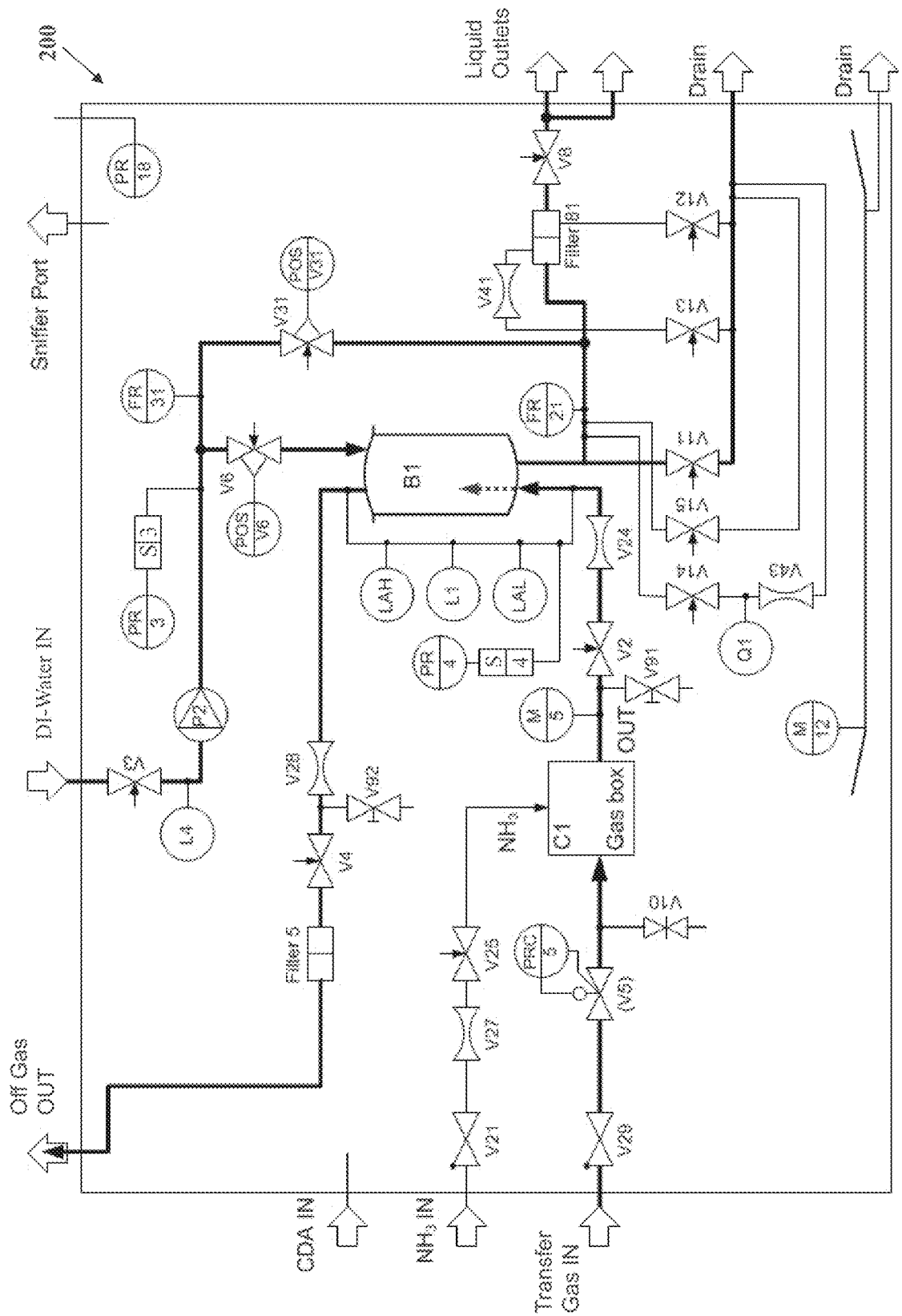
FIG. 2 is a detailed block diagram of an exemplary system for generating and delivering a conductive liquid comprising DI-water with $NH_3$ gas dissolved therein according to embodiments of the technology described herein.

FIG. 2 shows a detailed diagram of an exemplary system 200 for generating and delivering a conductive liquid comprising DI-water with $NH_3$ gas dissolved therein.

System 200 includes a gas box or gas mixing device C1 for mixing a transfer gas with $NH_3$ gas. Gas mixing device C1 is in fluid communication with a contactor B1 which is used to dissolve $NH_3$ gas in DI-water. The gas mixing device C1 includes a first inlet for receiving $NH_3$ gas, and a second inlet for receiving a transfer gas.

$NH_3$ gas from a first gas source is supplied to the first inlet of gas mixing device C1 by way of check valve V21 which can help avoid contamination caused by the transfer gas flowing into the $NH_3$ supply lines, flow restrictor V27 which can limit the $NH_3$ flow in case of a gas leak in the supply, and pneumatic 2-way valve V25 which can be used to isolate the $NH_3$ inlet upon shutdown of system 200.

Transfer gas from a second gas source is supplied to the second inlet of gas mixing device C1 by way of check valve V29 which can help avoid cross contamination of $NH_3$ gas into the transfer gas supply, and pressure regulator PRC5 (including valve V5) which is used to control the transfer gas pressure. Pressure relief valve V10 is positioned between pressure regulator PRC5 and the second inlet of gas mixing device C1, and can be used as a safety device to relieve pressure buildup in the supply line before catastrophic system failure.

A gas mixture comprising $NH_3$ gas and the transfer gas is supplied from an outlet of gas mixing device C1 to an inlet of contactor B1 by way of pneumatic 2-way valve V2 which can isolate gas mixing device C1 from contactor B1 upon shutdown and during alarm conditions, and flow restrictor V24 which can limit liquid backflow into gas mixing device C1 in the event of an unexpected pressure increase. Capacitive liquid sensor M5 is positioned near the outlet of gas mixing device C1 and acts as a safety sensor for detecting backflow of liquid. In some embodiments, capacitive liquid sensor M5 is used in conjunction with flow restrictor V24 as part of system 200's safety measures. Manual 2-way valve V91 allows the mixed gas supply line to be purged during system maintenance.

In the diagram of FIG. 2, the inlet of contactor B1 for receiving the gas mixture via flow restrictor V24 is shown positioned at the bottom of contactor B1. The diagram reflects the typical operating mode of a gas-liquid contacting device like contactor B1 in which the gas is let in at the lowest possible position into the contacting device in order to achieve the highest possible mass transfer rate between gas and liquid. Somewhat counterintuitively, supplying the gas mixture from this point in contactor B1 can cause large fluctuations in the conductivity of the outlet liquid, which is undesirable.

In some embodiments, better stability of the output liquid conductivity can be achieved by positioning the opening of the contactor inlet within contactor B1 so that it is substantially at the mean level or height of the liquid in the contactor. This concept is denoted in FIG. 2 by the dashed line extending from the contactor inlet toward the center of contactor B1. Accordingly, even when the gas inlet of contactor B1 is physically positioned to supply the gas mixture at or near the bottom of contactor B1, the exit orifice of the inlet tube internal to contactor B1 can be positioned at a height that results in better stability of the conductivity of the output liquid.

Contactor B1 can further include an outlet for expelling or venting off gas from the reactions occurring within it. For example, as the $NH_3$ from the gas mixture is dissolved into the DI-water within contactor B1, the transfer gas can be expelled from an outlet of contactor B1. In some embodiments, a minute portion of undissolved $NH_3$ gas is expelled from contactor B1. In some embodiments, the gas outlet of contactor B1 is in fluid communication with an exhaust port (FIG. 2, "Off Gas OUT") by way of flow restrictor V28 which can be used to effectively "throttle" the gas flow out of contactor B1, pneumatic 2-way valve V4 which can isolate the gas outlet at shutdown, and gas filter Filter 5 which is used to prevent contaminants from the exhaust from getting into the contactor B1 through its gas outlet. Further, manual 2-way valve V92 can be used as a purge valve for maintenance of system 200.

As shown in FIG. 2, DI-water can be supplied from a DI-water source to contactor B1 by way of pneumatic 2-way valve V3 which can isolate the DI-water inlet line at shutdown, and pneumatic 2-way valve V6 which can be used to control the flow rate of DI-water to the liquid inlet of contactor B1. Further, positioner POSV6 is a pneumatic positioning device that can be used to control the position of valve V6. P2 is an optional booster pump for providing sufficient water pressure to enable operation of system 200 in locations having a DI-water supply with limited pressure. In some embodiments, capacitive gas sensor L4 is in fluid communication with the DI-water supply line and is can be used to determine whether there is liquid inside the supply line.

System 200 further includes a bypass flow path for the DI-water supplied from the DI-water source. The bypass path can be used to dilute the liquid output from contactor B1. As shown in FIG. 2, positioner POSV31 is a pneumatic positioning device and can be used to control the bypass flow using continuous valve position adjustments of pneumatic 2-way valve V31. Flow Meter FR31 can measure the bypass flow of DI-water, and can therefore be used to determine the required positions of the valves in the bypass path to control the mixing ratio of DI-water having $NH_3$ dissolved therein from contactor B1 with unmixed DI-water without dissolved ammonia. Measurements of the inlet DI-water pressure from pressure sensor PR3 can also be used to calculate the desired valve positions for valves V6 and V31. In some embodiments, separator S3 is positioned between the DI-water supply line and pressure sensor PR3. Separators such as separator S3 can be used to prevent liquid in system 200 from being contaminated as a result of coming into contact with the stainless steel housings or bodies of the pressure sensors. In some embodiments, system 200 includes one or more pressure sensors that are constructed of materials that can come into direct contact with the liquid in system 200.

In order to maintain sufficient pressure at the liquid outlet of contactor B1 and to facilitate a constant, stable concentration of $NH_3$ in the output liquid, the pressure inside of contactor B1 is measured and controlled. The pressure control acts on the DI-water flow from the DI-water source into contactor B1 or the bypass path. The pressure of the DI-water supplied by the DI-water source is measured by pressure sensor PR3 and the pressure inside of contactor B1 is measured by pressure sensor PR4. In some embodiments, separator S4 is positioned between the mixed gas supply line and pressure sensor PR4. These pressure measurements can be used to calculate the opening position of valve V6. A controller (e.g., FIG. 1, control module 125) can be used to control the opening position of valve V6 via positioning device POSV6.

The pressure control principles described herein decouple the inlet DI-water pressure from the outlet liquid pressure and advantageously maintain a stable pressure inside of contactor B1. This is critical as pressure fluctuations in contactor B1 can result in an accumulation of $NH_3$-gas in the gas supply line that does not immediately get dissolved in the DI-water, causing a concentration drop in the conductive output liquid. It is therefore important to maintain a stable pressure inside of contactor B1.

In some embodiments, contactor B1 is a packed column or packed tower type contactor that is filled with tower packing in order to provide a substantial gas-liquid contact surface as the liquid flows from the top to the bottom of the contactor.

A certain liquid level can be maintained within contactor B1. For example, a parallel line to contactor B1 acts as level gauge, where the liquid level is measured with capacitance meter L1. In some embodiments, the liquid level is maintained substantially in the lower portion of contactor B1 and contactor B1 is primarily filled with gas.

Capacitive liquid sensor LAH measures the liquid level inside contactor B1 and provides an alarm if it rises too high as a safety feature to help avoid having liquid flow into the gas outlet of contactor B1. Capacitive gas sensor LAL also measures the liquid level inside contactor B1 and provides an alarm if the liquid level becomes too low as a safety feature to help avoid having gas flow into the liquid outlet of contactor B1.

A conductive output liquid (e.g., DI-water with $NH_3$ dissolved therein) having a conductivity according to the conductivity set point selected by the user can be output from at least one liquid outlet of contactor B1 for use in semiconductor fabrication operations (e.g., rinsing operations, wet cleaning operations). The at least one liquid outlet of contactor B1 can be in fluid communication with one or more liquid outlets of system 200 by way of filter Filter 81 which can filter the conductive output liquid, and pneumatic 2-way valve V8 which can isolate the liquid outlet of contactor B1 upon shutdown of system 200. Pneumatic 2-way valve V12 can be used as a filter drain valve for maintenance of system 200, and flow restrictor V41 can be used to limit the flow of liquid purged from filter Filter 81. Further, pneumatic 2-way valve V13 can be used for de-aeration of filter Filter 81.

In some embodiments, pneumatic 2-way valve V11 can be used as a central drain valve and pneumatic 2-way valve V15 can be used as an additional drain for various maintenance purposes.

The flow rate of the conductive liquid output from contactor B1 can be measured with flow meter FR21. In some embodiments, FR21 is an ultrasonic flow measurement device. In some embodiments, system 200 includes a flow sensor for measuring the flow rate of the DI-water from the DI-water source. The temperature of the conductive liquid output from contactor B1 can be measured at the outlet of the mixing device using sensor Q1. In some embodiments, sensor Q1 is a combined conductivity and temperature sensor, and also measures the conductivity of the liquid. In some embodiments, a separate sensor is used to measure the conductivity of the liquid output from contactor B1. As discussed above, the DI-water flow rate and conductive liquid temperature measurements can be used to calculate the required $NH_3$ gas flow rate, the feed forward control that is applied in order to achieve very fast conductivity changes upon liquid flow rate changes.

Flow restrictor V43 can be used to limit the flow of liquid through or by sensor Q1, and pneumatic 2-way valve V14 can be used to isolate sensor Q1 for shutdown. In some embodiments, system 200 includes capacity liquid sensor M12 which is a liquid sensor that is positioned in or on a drop pan to detect water leaks. In some embodiments, system 200 includes a drain to remove liquid that has leaked into the drop pan. In some embodiments, system 200 includes pressure sensor PR18 for measuring the differential pressure of a cabinet housing the components of system 200, and PR18 generates an alarm to indicate failure modes, such as the absence of exhaust flow from system 200. In some embodiments, clean dry air CDA is supplied to system 200 for operation of the pneumatically-controlled valves. In some embodiments, system 200 includes a sniffer port that can be used for detecting leaks in the components of system 200.

In exemplary system 200 described above, the gas mixture is supplied to an inlet positioned at or near the bottom of the contactor. Further, the gas mixture enters the liquid in the contactor via an exit orifice of the inlet tube that can also be positioned at or near the bottom of the contactor, or alternatively, can be positioned substantially at the mean level or height of the liquid in the contactor for better stability of the conductivity of the output liquid.

It was determined that the dosage point of the gas mixture to the DI-water influences the stability of the $NH_3$ concentration, and relatedly the conductivity, of the liquid in response to DI-water flow changes. The presence of stagnant "dead" volumes of gas and liquid in the contactor act as a buffer that can delay the reaction of the system to changes in the $NH_3$ flow rate. Accordingly, in some embodiments, it can be advantageous to provide the gas mixture into the upper part of the contactor, or directly into the DI-water supply line upstream of the liquid inlet of the contactor.

Figure 3:
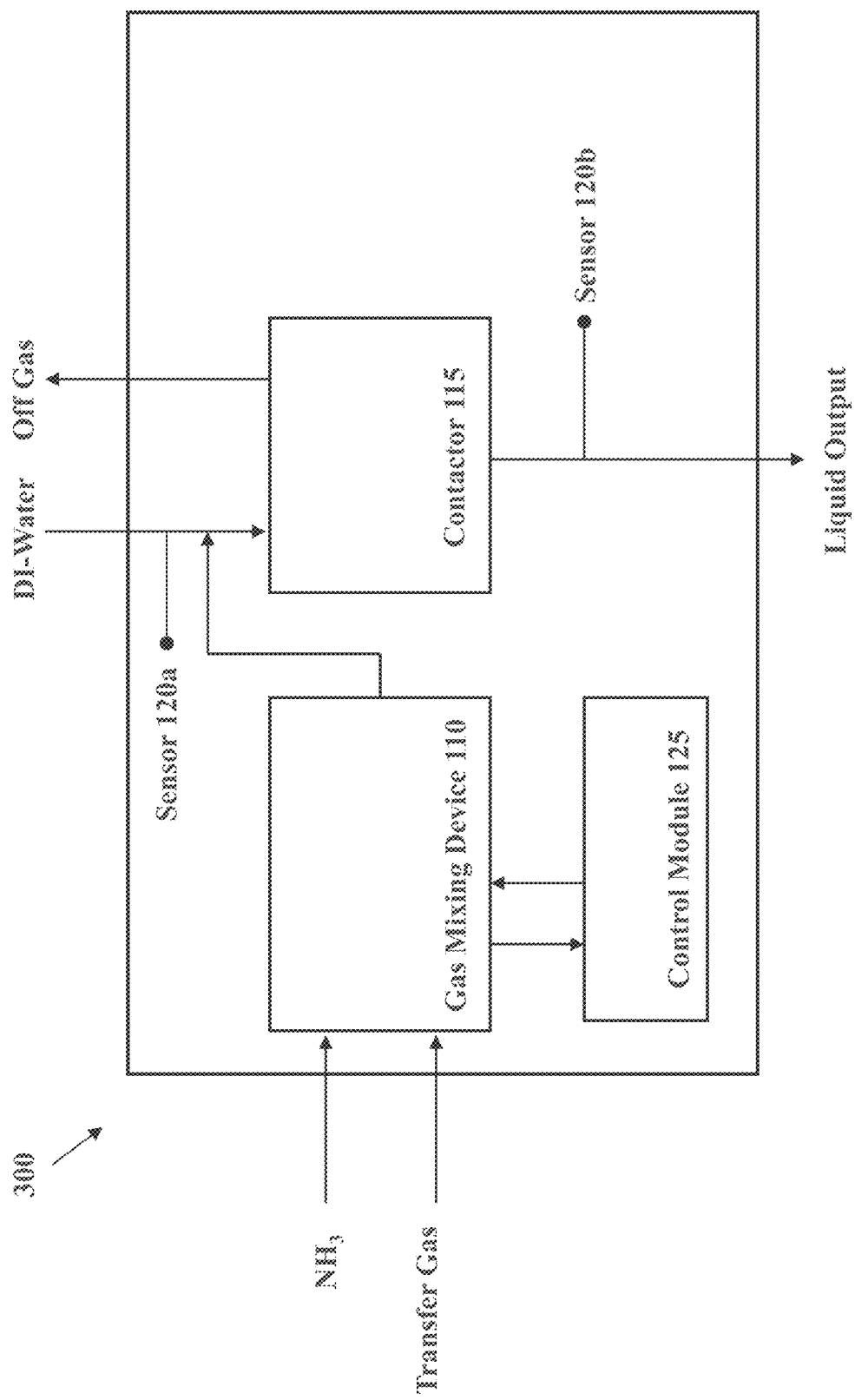
FIG. 3 is a block diagram of a second embodiment of a system for generating and delivering a conductive liquid comprising DI-water with $NH_3$ gas dissolved therein according to embodiments of the technology described herein.

FIG. 3 is a block diagram of a system 300 for producing and delivering DI-water having a desired concentration of $NH_3$ gas dissolved in it. System 300 is substantially similar to system 100 and includes gas mixing device 110, contactor 115, sensor 120a, and sensor 120b (collectively referred to as sensors 120). System 300 also includes a source of electrical power (not shown), and can include a control module 125.

However, as shown in FIG. 3, the gas mixture from gas mixing device 110 is supplied to the DI-water supply line upstream of the liquid inlet of contactor 115 instead of directly to a separate inlet of contactor 115. Further, a higher-diameter section of the DI-water supply line downstream of where the gas mixture is connected can have mixing elements installed in it. Accordingly, by dosing the gas mixture directly into the DI-water supply line, a majority of the $NH_3$ gas can be dissolved in the DI-water prior to entering contactor 115.

Subsequently, the conductive liquid comprising DI-water and the dissolved $NH_3$, together with the residual undissolved gas, is fed into the top of contactor 115. Contactor 115 can be a packed column or packed tower type contactor that is filled with tower packing in order to provide a substantial gas-liquid contact surface. Within contactor 115, the remaining undissolved $NH_3$ gas is dissolved in the liquid. At the same time, the liquid is mixed with itself resulting in a more uniform distribution of $NH_3$ in the liquid. Further, the liquid and the transfer gas are separated, and only the conductive liquid flows from the liquid outlet at the bottom of contactor 115, while the transfer gas is expelled from the off gas outlet at the top of contactor 115.

Figure 4:
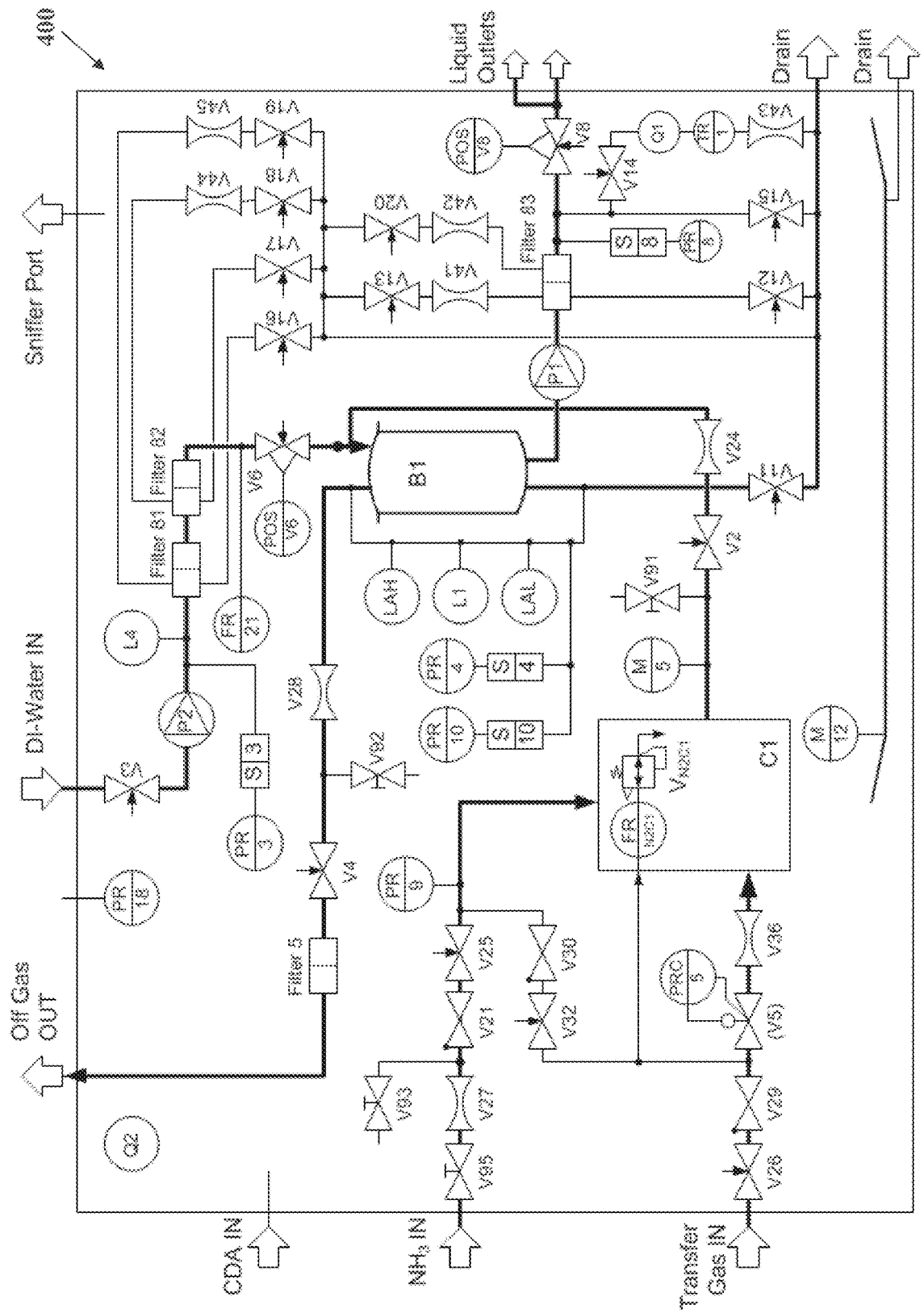
FIG. 4 is a detailed block diagram of an exemplary system for generating and delivering a conductive liquid comprising DI-water with $NH_3$ gas dissolved therein according to embodiments of the technology described herein.

FIG. 4 shows a detailed diagram of an exemplary system 400 for generating and delivering a conductive liquid comprising DI-water with $NH_3$ gas dissolved therein.

System 400 includes a gas box or gas mixing device C1 for mixing a transfer gas with $NH_3$ gas. Gas mixing device C1 is in fluid communication with a contactor B1 which is used to dissolve $NH_3$ gas in DI-water. The gas mixing device C1 includes a first inlet for receiving $NH_3$ gas, and a second inlet for receiving a transfer gas.

$NH_3$ gas from a first gas source is supplied to the first inlet of gas mixing device C1 by way of manual 2-way valve V95 for allowing manual control of the flow of gas as needed, flow restrictor V27 which can limit the $NH_3$ flow in case of a gas leak in the supply, check valve V21 which can help avoid contamination caused by the transfer gas flowing into the $NH_3$ supply lines, and pneumatic 2-way valve V25 which can be used to isolate the $NH_3$ inlet upon shutdown of system 400. Pressure sensor PR9 can be used to measure the pressure of the $NH_3$ gas for control and diagnostic purposes. Manual 2-way valve V93 allows the tightness of the $NH_3$ gas supply line to be checked after installation.

Transfer gas from a second gas source is supplied to the second inlet of gas mixing device C1 by way of pneumatic 2-way valve V26 which can isolate the transfer gas supply line at shutdown, check valve V29 which can help avoid cross contamination of $NH_3$ gas into the transfer gas supply, pressure regulator PRC5 (including valve V5) which is used to control the transfer gas pressure, and flow restrictor V36 which limits the transfer gas flow. For example, the flow of the transfer gas can be controlled by maintaining a calculated pressure difference across flow restrictor V36. This has the advantage that the flow of gas can be controlled while simultaneously obtaining diagnostic information about the gas inlet pressure. In some embodiments, pressure sensor PRC5 can also be used as a reference pressure sensor during startup of system 400.

System 400 further includes valves V32, V30, and $V_{N2C1}$, and flow meter $FR_{N2C1}$ for safety reasons and to allow the system to be purged of $NH_3$ gas for maintenance tasks. In some embodiments, flow meter $FR_{N2C1}$ and valve $V_{N2C1}$ are used to prevent a flammable mixture of $NH_3$ and air from forming inside of the gas mixing device in case of a $NH_3$ leak. For example, they can be used to provide the transfer gas such as $N_2$ in areas of insufficient gas exchange, where a $NH_3$ gas leak could cause a flammable mixture with air.

A gas mixture comprising $NH_3$ gas and the transfer gas is supplied from an outlet of gas mixing device C1 to the DI-water supply line upstream of contactor B1 by way of pneumatic 2-way valve V2 which can isolate gas mixing device C1 from the DI-water supply line upon shutdown and during alarm conditions, and flow restrictor V24 which can limit liquid backflow into gas mixing device C1 in the event of an unexpected pressure increase. Capacitive liquid sensor M5 is positioned near the outlet of gas mixing device C1 and acts as a safety sensor for detecting backflow of liquid. In some embodiments, capacitive liquid sensor M5 is used in conjunction with flow restrictor V24 as part of system 200's safety measures. Manual 2-way valve V91 allows the mixed gas supply line to be purged during system maintenance.

As shown in FIG. 4, DI-water can be supplied from a DI-water source to contactor B1 by way of pneumatic 2-way valve V3 which can isolate the DI-water inlet line at shutdown, and pneumatic 2-way valve V6 which can be used to control the flow rate of DI-water to the liquid inlet of contactor B1. Further, positioner POSV6 is a pneumatic positioning device that can be used to control the position of valve V6. P2 is an optional booster pump for providing sufficient pressure to enable operation of system 400 in locations having a DI-water supply with limited pressure.

Filters Filter 83 and Filter 82 can filter the DI-water prior to being supplied to the contactor to remove any particles that may have been introduced from the pumping action of pump P1 or from action of any of the valves in the supply line. Pneumatic 2-way valve V17 can be used as a filter drain valve for maintenance of system 400, and flow restrictor V44 can be used to limit the flow of liquid purged from filter Filter 82. Further, pneumatic 2-way valve V18 can be used for de-aeration of filter Filter 82. Similarly, pneumatic 2-way valve V16 can be used as a filter drain valve for maintenance of system 400, and flow restrictor V45 can be used to limit the flow of liquid purged from filter Filter 83. Pneumatic 2-way valve V19 can be used for de-aeration of filter Filter 83.

Measurements of the inlet DI-water pressure from pressure sensor PR3 can also be used to calculate the desired valve positions for valve V6. In some embodiments, separator S3 is positioned between the DI-water supply line and pressure sensor PR3.

In some embodiments, capacitive gas sensor L4 is attached to the outer surface of the DI-water supply line and can be used to determine whether there is liquid inside the supply line. The flow rate of the DI-water supply can be measured with flow meter FR21. In some embodiments, FR21 is an ultrasonic flow measurement device. In some embodiments, system 400 includes a flow sensor for measuring the flow rate of the conductive liquid from a liquid outlet of the contactor.

Contactor B1 can further include an outlet for expelling off gas from the reactions occurring within it. For example, as the $NH_3$ from the gas mixture is dissolved into the DI-water within contactor B1, the transfer gas can be expelled from an outlet of contactor B1. In some embodiments, a minute portion of undissolved $NH_3$ gas is expelled from contactor B1. In some embodiments, the gas outlet of contactor B1 is in fluid communication with an exhaust port (FIG. 4, "Off Gas OUT") by way of flow restrictor V28 which can be used to effectively "throttle" the gas flow out of contactor B1, pneumatic 2-way valve V4 which can isolate the gas outlet at shutdown, and gas filter Filter 5 which is used to prevent contaminants from the exhaust from getting into the contactor B1 through its gas outlet. Further, manual 2-way valve V92 can be used as a purge valve for maintenance of system 400.

In some embodiments, contactor B1 is a packed column or packed tower type contactor that is filled with tower packing in order to provide a substantial gas-liquid contact surface as the liquid flows from the top to the bottom of the contactor.

A certain liquid level can be maintained within contactor B1. For example, a parallel line to contactor B1 acts as level gauge, where the liquid level is measured with capacitance meter L1. In some embodiments, contactor B1 is mainly filled with gas and the liquid level is maintained substantially in the lower portion of contactor B1.

Capacitive liquid sensor LAH measures the liquid level inside contactor B1 and provides an alarm if it rises too high as a safety feature to help avoid having liquid flow into the gas outlet of contactor B1. Capacitive gas sensor LAL also measures the liquid level inside contactor B1 and provides an alarm if the liquid level becomes too low as a safety feature to help avoid having gas flow into the liquid outlet of contactor B1.

The control module controls the liquid level and the pressure within the contactor, measured at pressure sensors PR4 and PR10, by adjusting the water flow via valve V6 and the transfer gas pressure at PRC5. In particular, pressure sensor PR10 is used for safety purposes to detect overpressure within the contactor. In some embodiments, separator S4 is positioned between the mixed gas supply line and pressure sensor PR4, and separator S10 is positioned between the mixed gas supply line and pressure sensor PR10.

A conductive output liquid (e.g., DI-water with $NH_3$ dissolved therein) having a conductivity according to the conductivity set point selected by the user can be output from at least one liquid outlet of contactor B1 for use in semiconductor fabrication operations (e.g., rinsing operations, wet cleaning operations). The at least one liquid outlet of contactor B1 can be in fluid communication with one or more liquid outlets of system 400 by way of filter Filter 81 which can filter the conductive output liquid, and positioner POSV8, a pneumatic positioning device that can be used to control the flow of liquid from the system using continuous valve position adjustments of pneumatic 2-way valve V8. In some embodiments, system 400 includes a pump P1 to enhance the pressure of the conductive liquid output from the system.

Pneumatic 2-way valve V12 can be used as a filter drain valve for maintenance of system 400, and flow restrictors V41 and V42 can be used to limit the flow of liquid purged from filter Filter 81. Further, pneumatic 2-way valves V13 and V20 can be used for de-aeration of filter Filter 81. Pneumatic 2-way valve V15 can be used as an additional drain for various maintenance purposes. Pressure sensor PR8 can be used to measure the pressure of the conductive liquid. The controller can use the pressure measured at pressure sensor PR8 to determine how much to adjust the pumping power of pump P1, in order to provide a constant pressure at the outlet of system 400 at dynamically-changing liquid flow rates. In some embodiments, separator S8 is positioned between the conductive liquid supply line and pressure sensor PR8.

In some embodiments, pneumatic 2-way valve V11 can be used as a central drain valve and pneumatic 2-way valve V15 can be used as an additional drain for various maintenance purposes.

The temperature of the conductive liquid output from contactor B1 can be measured at the outlet of the mixing device using sensor Q1, and the conductivity of the conductive liquid can be measured using sensor TR1. In some embodiments, sensor Q1 is a combined conductivity and temperature sensor. Flow restrictor V43 can be used to limit the flow of liquid through or by sensor Q1 and sensor TR1, and pneumatic 2-way valve V14 can be used to isolate sensor Q1 and sensor TR1 for shutdown.

As discussed above, the DI-water flow rate and conductive liquid temperature measurements are used in conjunction with the conductivity set point to calculate the required $NH_3$ gas flow rate, the feed forward control that is applied in order to achieve very fast conductivity changes upon liquid flow rate changes. In some embodiments, the $NH_3$ gas flow rate calculations are based on measurements of the flow rate of the conductive liquid output from contactor B1. In some embodiments, the $NH_3$ gas flow rate calculations are based on temperature measurements of the DI-water supplied from the DI-water source. In some embodiments, a static temperature value is used for the $NH_3$ gas flow rate calculations.

In some embodiments, system 400 includes capacity liquid sensor M12 which is a liquid sensor that is positioned in or on a drop pan to detect water leaks. In some embodiments, system 400 includes a drain to remove liquid that has leaked into the drop pan. In some embodiments, system 400 includes pressure sensor PR18 for measuring the differential pressure of a cabinet housing the components of system 400, and PR18 generates an alarm to indicate failure modes, such as the absence of exhaust flow from system 400. In some embodiments, system 400 uses sensor Q2 as a safety monitor for monitoring the $NH_3$ level of the cabinet to detect $NH_3$ gas leaks. In some embodiments, clean dry air CDA is supplied to system 400 for operation of the pneumatically-controlled valves. In some embodiments, system 400 includes a sniffer port that can be used for detecting leaks in the components of system 400.

Figure 5:
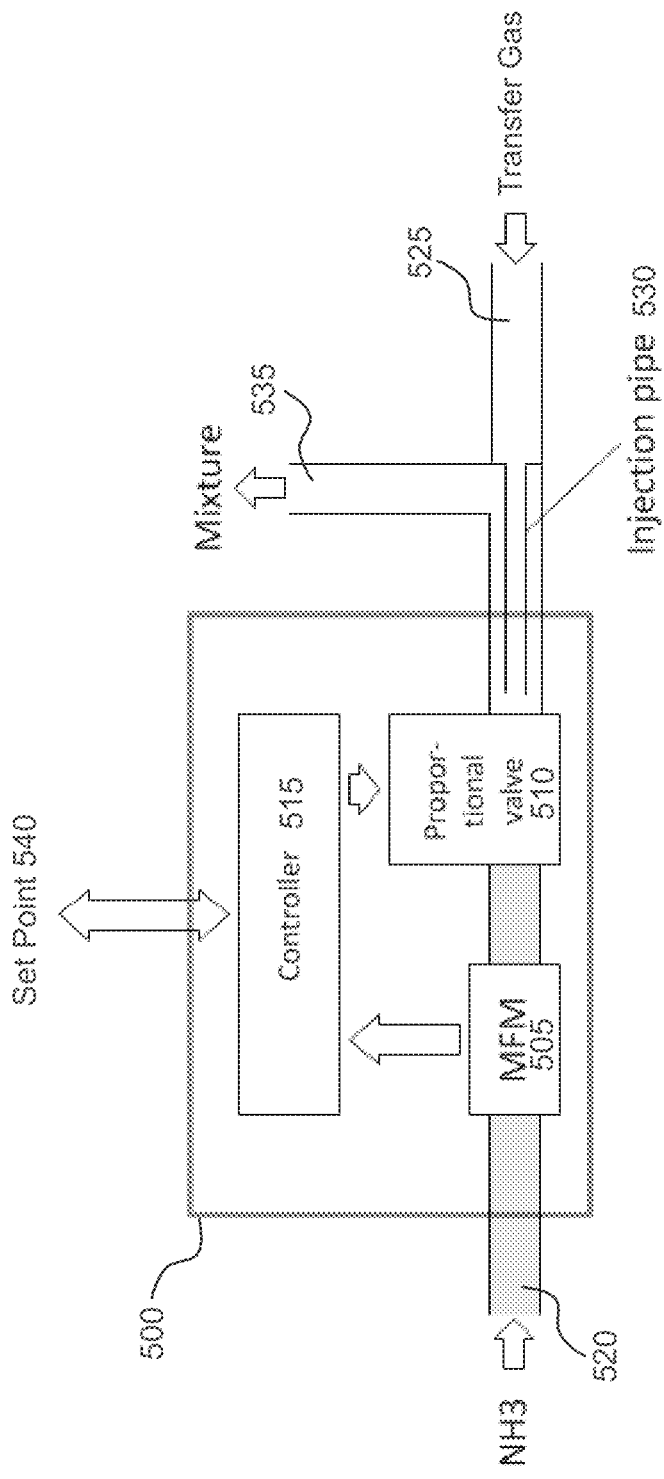
FIG. 5 is a block diagram of an exemplary gas mixing device according to embodiments of the technology described herein.

FIG. 5 is a block diagram of an exemplary gas mixing device 500 according to embodiments of the technology described herein. Gas mixing device 500 is used for mixing $NH_3$ gas supplied at first inlet 520 with a transfer gas (e.g., $N_2$ gas) supplied at inlet 525, and outputting the resulting gas mixture via mixed gas outlet 535.

The flow rate of the transfer gas can be controlled using a mass flow controller or a pressure controller with a flow restrictor positioned behind it. The flow rate of the $NH_3$ gas can be controlled using one or more mass flow controllers. The example of FIG. 5 shows components of a single mass flow controller for controlling the flow of $NH_3$ gas. The mass flow controller includes mass flow meter MFM 505 in fluid communication with inlet 520 and proportional valve 510 which is further in fluid communication with mixed gas outlet 535. The mass flow controller further includes controller 515 in electrical communication with MFM 505 and proportional valve 510. Controller 515 receives a set point 540 from another controller or processor (e.g., control module 125 of FIGS. 2 and 3), compares it to the measured flow rate from MFM 505, and adjusts proportional valve 510 accordingly to achieve the flow rate specified by set point 540.

Turbulent gas flows and fluctuations in pressure can result in a non-uniform mixture of $NH_3$ gas and the transfer gas in the gas mixing device. The effects of these irregularities can become more pronounced as the length of the $NH_3$ gas supply line increases. Even the outlet stub of the $NH_3$ mass flow controller contributes to an uneven $NH_3$ dosage in the gas mixture, as such a small amount of $NH_3$ gas is needed to influence the conductivity of the output liquid. For example, in a typical mass flow controller, the proportional valve is located inside of a metal body with an outlet port to connect to a gas pipe or tube. The typically short internal flow channel from the proportional valve to the connection fitting at the outlet can still contain enough unmixed $NH_3$ to cause dosage fluctuations in the gas mixture, even at slight pressure changes in the system. These dosage fluctuations are unwanted in semiconductor manufacturing as they result in fluctuations in the conductivity of the liquid in the outlet of the system. It was therefore not possible to achieve the required stability of the conductivity of the liquid in the outlet of the system using known configurations.

However, usage of a standard mass flow controller is preferred due to cost advantages over a custom design. The present technology is configured to overcome the issues described above. In some embodiments, the transfer gas is fed through a central injection tube or pipe (e.g., injection pipe 530) directly to the opening of the proportional valve outlet of the mass flow controller used to control the flow of $NH_3$ gas. The injection tube can be mounted in a t-fitting with an opening positioned such that the mixing point of the transfer gas with the $NH_3$ is moved from the far end of the connection fitting to substantially at or near the internal outlet of the mass flow controller proportional valve. In some embodiments, the opening of the transfer gas injection tube is approximately 5 to 10 mm from the internal outlet of the mass flow controller proportional valve. This measure can reduce the pure (e.g. unmixed) $NH_3$ gas volume in the system, and therefore reduce or eliminate the influence that fluctuations in the internal pressure of the contactor has on the stability of the conductivity of the liquid in the outlet of the system. At the same time, standard mass flow controllers can still be used in the system, providing an economic advantage.

The required flow rate of the $NH_3$ gas in the system is comparatively small. For example, in a typical system with a liquid flow range from 0.5 L/min to 32 L/min at a given temperature with a conductivity set point between 5 μS/cm and 40 μS/cm, the $NH_3$ gas flow can be between 0.48 sccm and 1197 sccm. In certain cases, higher flow and conductivity ranges are used with a flow rate, for example, a liquid flow rate of 48 L/min and a conductivity set point of up to 200 μS/cm, which requires a $NH_3$ gas flow of about 41.1 slm. Nevertheless, the required gas flow range can span at least three magnitudes for some exemplary applications, which cannot be covered by a single mass flow controller which typically can cover a flow range of one- to one-and-a-half magnitudes.

Figure 6:
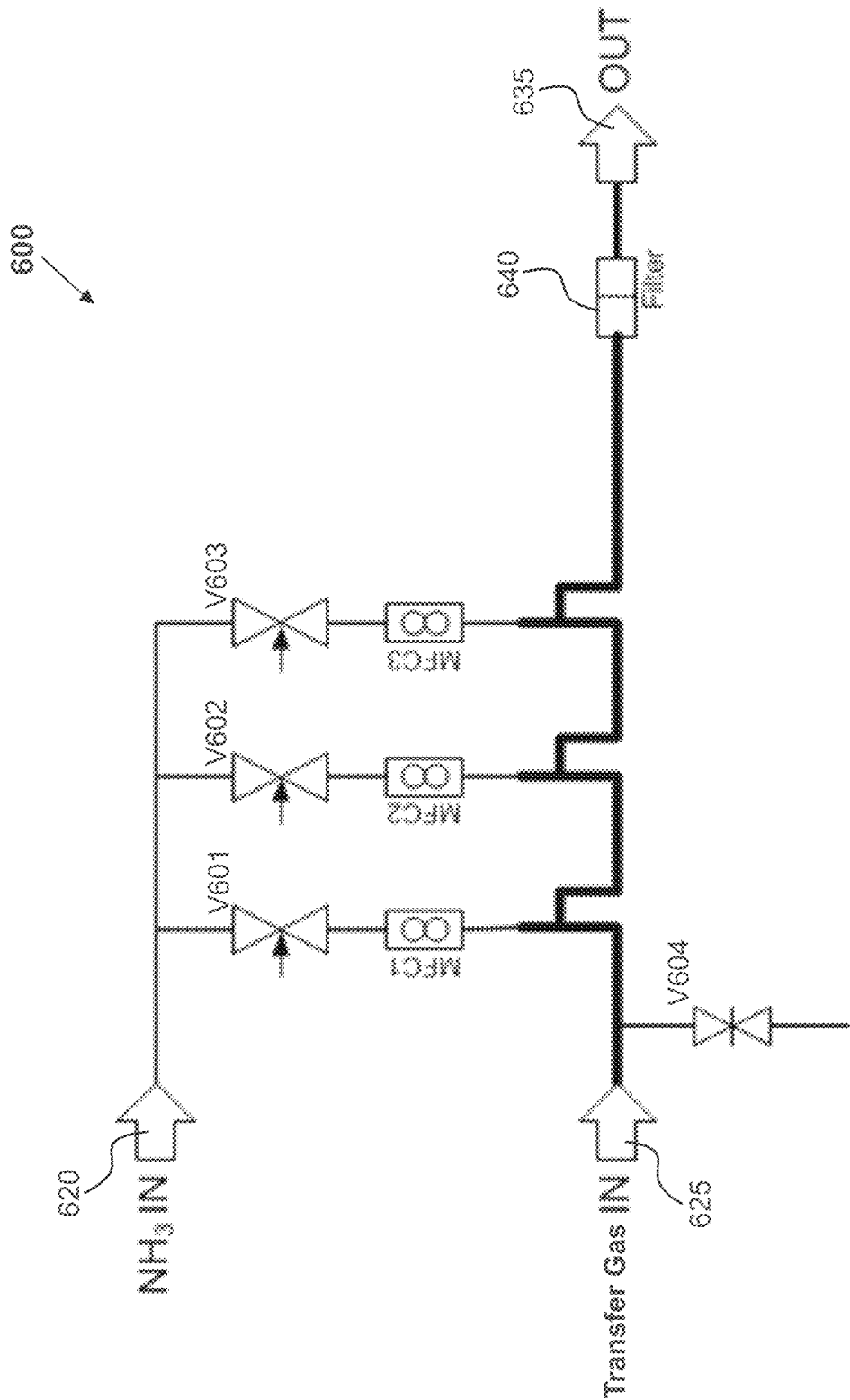
FIG. 6 is a block diagram of an exemplary gas mixing device according to embodiments of the technology described herein.

In some embodiments, the gas mixing device includes a plurality of mass flow controllers to cover a large range of required $NH_3$ gas flows. FIG. 6 is a block diagram of an exemplary gas mixing device 600 according to embodiments of the technology described herein. Gas mixing device 600 is used for mixing $NH_3$ gas supplied at first inlet 620 with the transfer gas (e.g., $N_2$ gas) supplied at inlet 625, and outputting the resulting gas mixture via mixed gas outlet 635. Gas mixing device 600 includes three mass flow controllers (MFC1-MFC3), and inlet valves V601-V603 to supply the $NH_3$ gas to MFC1-MFC3, respectively. Filter 640 can be used to filter the mixed gas prior to being provided to the contactor. Pressure relief valve V604 can be used as a safety device to relieve pressure buildup in the supply line before catastrophic system failure.

Although FIG. 6 shows three mass flow controllers, one of ordinary skill in the art would appreciate that fewer or more mass flow controllers can be used without departing from the spirit and the scope of the technology.

Each of mass flow controllers MFC1-MFC3 is equipped with a central injection tube similar to injection pipe 530 of FIG. 5 for injecting the flow of transfer gas substantially at or near the internal outlet of each mass flow controller's proportional valve (not shown). Accordingly, the full flow of the transfer gas can be applied to all mass flow controllers used to feed $NH_3$ into the transfer gas. During operation, the flow of the transfer gas is varied in response to the measured liquid flow rate, in order to account for the solubility of the transfer gas in the water. In some embodiments, the transfer gas is controlled in response to the flow of the $NH_3$ gas to act as a buffer between the $NH_3$ and the DI-water. The flow rate of the transfer gas is also used to maintain the liquid level inside of the contactor.

In some embodiments, the gas mixing device includes one or more fast switching valves instead of one or more mass flow controllers to control the $NH_3$ gas flow. Because fast switching valves can have switching times in the millisecond range or below, a nearly continuous flow of $NH_3$ gas can be supplied to the system. The switching valves are arranged in such way that there is no large $NH_3$ gas volume downstream of the switching valves. In some embodiments, this is achieved with an injection tube for supplying the transfer gas directly to the valve closures.

FIG. 7 is a flow diagram of a method 700 for dissolving $NH_3$ gas in DI-water, according to embodiments of the technology described herein. $NH_3$ gas can be supplied (705) to a first inlet of a gas mixing device. As described above, the gas mixing device can have a first inlet in fluid communication with a first gas source for supplying $NH_3$ gas to the gas mixing device. A transfer gas can be supplied (710) to a second inlet of the gas mixing device. For example, the gas mixing device can have a second inlet in fluid communication with a second gas source for supplying a transfer gas to the gas mixing device.

The $NH_3$ gas and the transfer gas can be mixed within the gas mixing device to create a gas mixture. The gas mixture comprising the $NH_3$ gas and the transfer gas from the gas mixing device and DI-water can be supplied (715) to a contactor. In some embodiments, the gas mixing device includes a mixed gas outlet that is in fluid communication with a gas inlet of the contactor, and the DI-water is in fluid communication with a liquid inlet of the contactor.

In some embodiments, the gas mixture is provided to the DI-water supply line upstream of the contactor. For example, the mixed gas outlet of the gas mixing device can be in fluid communication with the DI-water supply line at a location upstream of an inlet substantially at or near the top of the contactor. This configuration is advantageous because a substantial portion of the $NH_3$ gas can be dissolved in the DI-water prior to entering the contactor where the remaining $NH_3$ gas can be dissolved. To further enhance this effect, a static mixer can be positioned in-line with the DI-water supply downstream of the location where the gas mixture is provided to the DI-water supply line, but upstream of the contactor inlet.

The flow rate of the DI-water can be measured (720), and a flow rate of the $NH_3$ gas can be set (725) based on the measured flow rate of the DI-water and a predetermined conductivity set point. For example, as described above, a control module in the system can set the required dosage of $NH_3$ gas to provide to the gas mixing device based on calculations using a measurement of the DI-water flow rate and a conductivity set point (e.g., Kappa) provided by the user to indicate the desired conductivity of the resulting conductive liquid that is output from the system. The required flow rate of $NH_3$ gas can be proportional to the desired DI-water flow rate and/or conductivity of the resulting conductive liquid. In some embodiments, the $NH_3$ flow rate calculations are based on a flow rate measurement of the conductive liquid output instead of the DI-water flow rate.

As described in detail above, the calculation of the required flow rate or dosage of $NH_3$ gas to supply can be based on predetermined assumptions about the temperature range of the liquid in the system without requiring an actual temperature measurement to be obtained. This can provide certain advantages such as lower up front equipment complexity and cost, as well as lower cost of ownership from not having to maintain the additional components that would be required for making temperature measurements. Further, development time of the system software can be reduced with fewer active components to integrate, and processing times can be reduced as no processing cycles are dedicated to obtaining the temperature measurement, and the temperature value used for the calculations can be static.

In some embodiments, a temperature sensor is positioned at or near an inlet of the contactor for sensing or measuring the temperature of the DI-water (or the DI-water and gas mixture) entering the contactor. In some embodiments, a temperature sensor is positioned at or near an outlet of the contactor for sensing or measuring the temperature of the conductive liquid (e.g., DI-water with $NH_3$ gas dissolved therein) that is output from the contactor. The control module can be in communication with the one or more temperature sensors, and can periodically or constantly receive sensor output signals indicating the temperature of the liquid.

The temperature measurements can be used for applications that require greater accuracy of the conductivity of the resulting conductive liquid. For example, instead of using an assumed or static liquid temperature value for calculations of the required $NH_3$ gas flow rate, the control module can perform its calculations using a measurement of the actual temperature of the liquid in addition to the measurement of the DI-water flow rate and the conductivity set point provided by the user.

The DI-water having $NH_3$ gas dissolved therein can be flowed (730) from the contactor. In some embodiments, the DI-water having $NH_3$ gas dissolved therein flows from a liquid outlet of the contactor and exits the system for use in a wet cleaning operation. In some embodiments, the system includes a pump downstream of the contactor outlet for enhancing the pressure of the conductive liquid supplied by the system.

Figure 8:
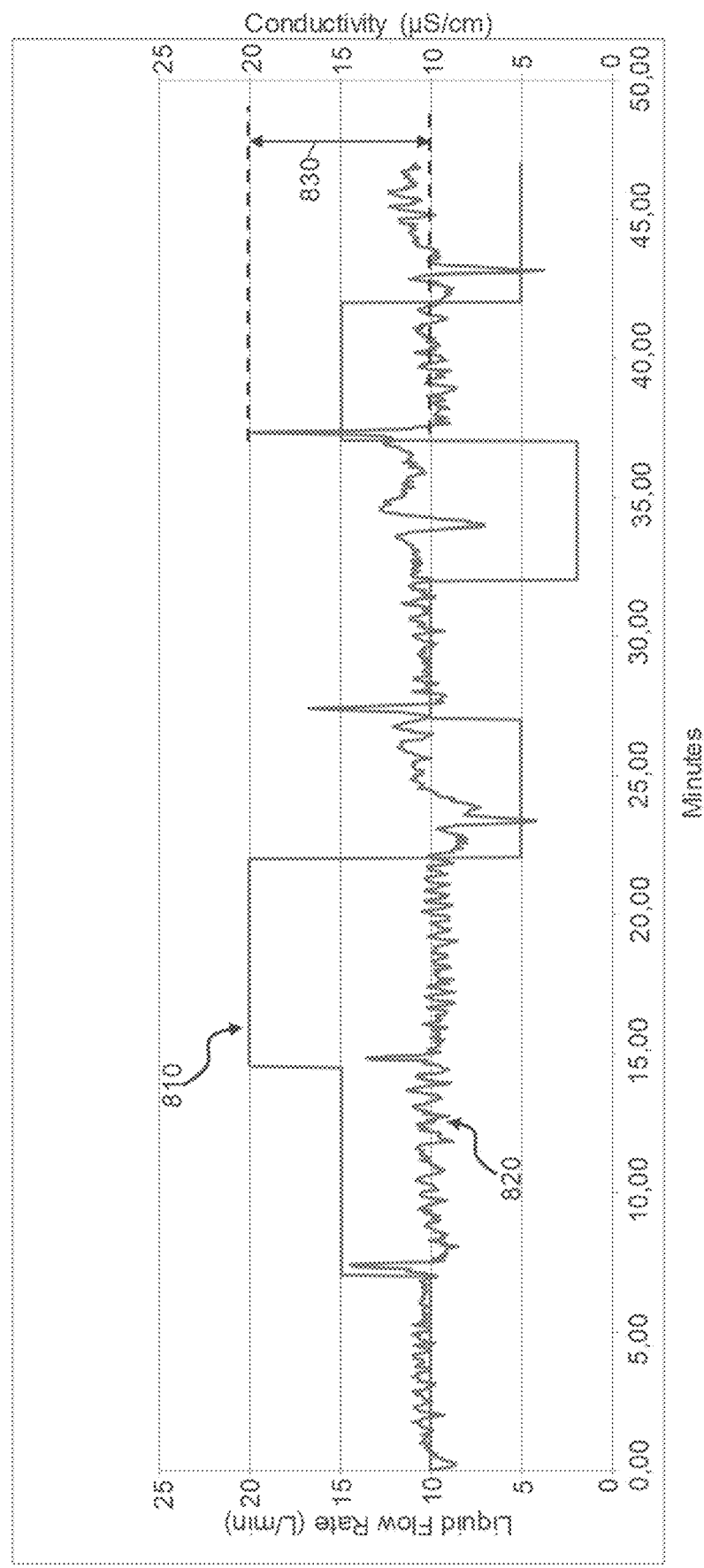
FIG. 8 is a graph of the performance of an exemplary system for generating and delivering a conductive liquid comprising DI-water with $NH_3$ gas dissolved therein, according to embodiments of the technology described herein.

FIG. 8 is a graph of the performance of an exemplary system for generating and delivering a conductive liquid comprising DI-water with $NH_3$ gas dissolved therein. The exemplary system is designed with a gas inlet at the bottom of a tower packing column, which is the typical configuration for such a system. FIG. 8 includes a curve 820 corresponding to the conductivity of the liquid output from the contactor in μS/cm overlaid with a curve 810 indicating the flow rate of liquid in the system in L/min measured over the course of 50 minutes of system operation with a conductivity set point of 10 μS/cm.

During operation of the system, the liquid flow rate was increased or decreased periodically while conductivity of the output liquid was measured. As shown in FIG. 8, the conductivity of the output liquid generally fluctuates less than 5 μS/cm from the set point, with larger momentary deviations following a change in the liquid flow rate, and deviation 830 being the largest observed deviation of approximately 10 μS/cm from the set point.

Figure 9:
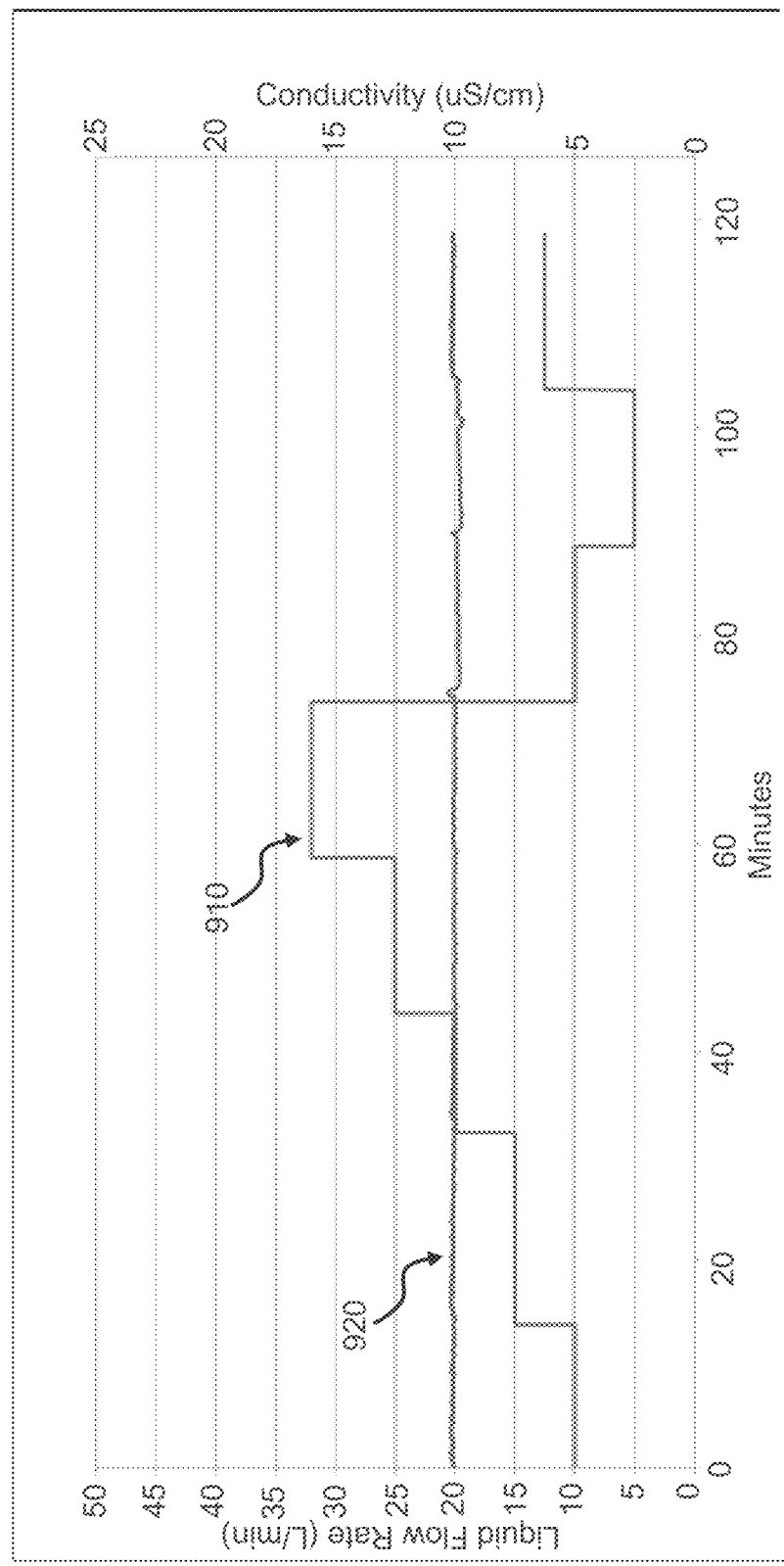
FIG. 9 is a graph of the performance of an exemplary system for generating and delivering a conductive liquid comprising DI-water with $NH_3$ gas dissolved therein according to embodiments of the technology described herein.

FIG. 9 is a graph of the performance of an exemplary system for generating and delivering a conductive liquid comprising DI-water with $NH_3$ gas dissolved therein. The system corresponding to the graph of FIG. 9 includes optimizations described herein (e.g., FIGS. 4 and 5) such as supplying the mixed gas outlet to the DI-water supply line upstream of the contactor inlet.

FIG. 9 includes a curve 920 corresponding to the conductivity of the liquid output from the contactor in μS/cm overlaid with a curve 910 indicating the flow rate of liquid in the system in L/min measured over the course of 120 minutes of system operation with a conductivity set point of 10 μS/cm.

During operation of the system, the liquid flow rate was increased or decreased periodically while conductivity of the output liquid was measured. As shown in FIG. 9, the conductivity of the output liquid generally fluctuates less than 1 μS/cm from the set point, with only small brief momentary deviations of 1 μS/cm or less following a change in the liquid flow rate.

Accordingly, as demonstrated, the present technology can maintain a precise control of the output liquid conductivity over a substantially higher range of liquid flow than existing systems. The applied control system only feeds the required $NH_3$ gas into the system, without any excess, providing an economic advantage over existing systems. Further, due to the direct contact between gas and DI-water, the $NH_3$ absorption in the water is nearly 100%. For a typical conductivity set point for the supplied liquid of, for example, 40 μS/cm, ammonium is not detectable in the off gas, resulting in a much lower risk of $NH_3$ contamination of the ambient than existing systems.

Further, solutions of $NH_3$ can exhibit an etching behavior to silicon. For certain semiconductor processes, such as treatment of advanced transistor structures (e.g., finFETs), a defined but only very small etching capability is required. Defined dilute $NH_3$ solutions can have the required etching capability at a certain $NH_3$ concentrations, but it is critical to tightly control the applied $NH_3$ concentration so as not to etch away more than is required. Accordingly, the technology described herein provides a solution for semiconductor processes for treatment of advanced transistor structures.

The etching capability of $NH_3$ solutions is additionally modified by the oxygen content of the solution. Certain semiconductor applications need a low oxygen content in the $NH_3$ solution. This is difficult to achieve by dilution of concentrated $NH_3$, which is typically oxygen saturated due to a long storage time. Degassing of such a solution is difficult, as under such conditions $NH_3$ is typically also stripped form the solution. Accordingly, generation of a dilute $NH_3$ solution out of $NH_3$ gas and DI-water according to the techniques described herein overcomes this problem, as the DI-water can be degassed with conventional techniques and pure $NH_3$ gas only contains insignificant traces of oxygen.

Cobalt is replacing materials such as tungsten in the fabrication of new semiconductor devices such as finFETs. According to a Pourbaix diagram for cobalt in an aqueous solution, below a pH of 9 cobalt has the potential to form a corrosive ion ($Co^{2+}$). With a typical pH value less than 6, DI-water can thermodynamically corrode cobalt. Thus, rinsing with DI-water as is typically done in the last step of fabrication, will attack the metal, starting from cracks in the surface down to significant material loss. Homeopathic addition of $NH_4OH$ has been found to act as inhibitor and stop this corrosion simply by shifting the pH of DI-water. Conversely, higher concentrations of $NH_4OH$ have been found to dissolve the $Co(OH)_2$ with $[Co(NH_3)_4]^{2+}$ complexes, which again increase the risk of galvanic corrosion.

It is therefore important to control the pH of the liquid solution in a tight region. As there is a correlation between the pH of a liquid and its conductivity, a reliable control method is to control the conductivity of the $NH_3$ solution. Accordingly, the technology described herein likewise provides a solution for control of pH in solutions used for semiconductor processes for treatment of advanced transistor structures.

Variations, modifications, and other implementations of what is described herein will occur to those of ordinary skill in the art without departing from the spirit and the scope of the invention. Accordingly, the invention is not to be limited only to the preceding illustrative descriptions.

What is claimed is:

1. A system for dissolving ammonia gas in DI-water, the system comprising:
   a deionized water source;
   a gas mixing device comprising:
      a first inlet in fluid communication with a first gas source for supplying ammonia gas;
      a second inlet in fluid communication with a second gas source for supplying a transfer gas;
      a mixed gas outlet for outputting a gas mixture comprising the ammonia gas and the transfer gas;
      at least one flow control device in fluid communication with the first inlet of the gas mixing device to control a flow of the ammonia gas; and
      a gas injector in communication with the second inlet, the gas injector being positioned within the gas mixing device to direct a flow of the transfer gas to an opening of an outlet of the at least one flow control device within the gas mixing device;
   a contactor in fluid communication with the deionized water source and the mixed gas outlet via at least one inlet of the contactor, the contactor generating deionized water having ammonia gas dissolved therein;
   a sensor in fluid communication with the at least one inlet of the contactor for measuring a flow rate of the deionized water; and
   a controller in communication with the sensor, the controller configured to adjust a pressure of the transfer gas output from the second gas source based on the flow rate of the deionized water measured by the sensor.

2. The system of claim 1 wherein the mixed gas outlet is in fluid communication with the deionized water source upstream of the at least one inlet of the contactor.

3. The system of claim 2 further comprising a static mixing device positioned upstream of the at least one inlet of the contactor, the static mixing device for mixing the gas mixture output from the gas mixing device with deionized water output from the deionized water source.

4. The system of claim 1 wherein the contactor is a packed column or packed tower type contactor.

5. The system of claim 1 wherein the at least one outlet of the contactor comprises:
   a gas outlet for expelling an off gas from the contactor; and
   a liquid outlet for outputting the deionized water having ammonia gas dissolved therein.

6. The system of claim 1 further comprising a fluid level sensor in fluid communication with the top and the bottom of the contactor.

7. The system of claim 1 further comprising a pressure sensor in fluid communication with the contactor.

8. The system of claim 1 further comprising a temperature sensor in fluid communication with one of:
   the at least one inlet of the contactor for measuring a temperature of the deionized water; and
   at least one outlet of the contactor for measuring a temperature of the deionized water having ammonia gas dissolved therein.

9. The system of claim 8 further comprising a controller in communication with the sensor and the temperature sensor, the controller configured to set a flow rate of the ammonia gas supplied from the first gas source based on at least one of a temperature measured by the temperature sensor, the flow rate of the deionized water measured by the sensor or a predetermined conductivity set point.

10. The system of claim 1 further comprising a pump in fluid communication with the at least one liquid outlet of the contactor.

11. The system of claim 1 wherein the mixed gas outlet is in fluid communication with the deionized water source.

12. The system of claim 1 wherein the at least one inlet of the contactor comprises:
    a liquid inlet in fluid communication with the deionized water source; and
    a gas inlet in fluid communication with the mixed gas outlet.

13. The system of claim 12 wherein the gas inlet comprises an exit orifice within the contactor that is positioned substantially at a mean level of a liquid in the contactor.

14. A method for dissolving ammonia gas in deionized water, the method comprising:
    supplying ammonia gas to a first inlet of a gas mixing device;
    controlling a flow rate of the ammonia gas supplied to the gas mixing device with at least one flow control device;
    supplying a transfer gas to a second inlet of the gas mixing device;
    directing a flow of the transfer gas within the gas mixing device to an opening of an outlet of the at least one flow control device of the gas mixing device;
    supplying a gas mixture comprising the ammonia gas and the transfer gas from the gas mixing device and deionized water to a contactor;
    measuring a flow rate of the deionized water;
    flowing the deionized water having ammonia gas dissolved therein from the contactor; and
    adjusting a pressure of the transfer gas based on the flow rate of the deionized water.

15. The method of claim 14 further comprising mixing the gas mixture output from the gas mixing device with the deionized water upstream of the contactor.

16. The method of claim 14 wherein the contactor is a packed column or packed tower type contactor.

17. The method of claim 14 further comprising:
    expelling an off gas from a gas outlet of the contactor; and
    flowing the deionized water having ammonia gas dissolved therein from a liquid outlet of the contactor.

18. The method of claim 14 further comprising sensing a fluid level of fluid in the contactor.

19. The method of claim 14 further comprising sensing a fluid pressure of fluid in the contactor.

20. The method of claim 14 further comprising sensing a temperature of at least one of: (i) the deionized water, and (ii) the deionized water having ammonia gas dissolved therein.

21. The method of claim 20 further comprising setting a flow rate of the ammonia gas to supply based on at least one of the temperature, the flow rate of the deionized water or a predetermined conductivity set point.

22. The method of claim 14 wherein flowing further comprises pumping the deionized water having ammonia gas dissolved therein from the contactor via a liquid outlet of the contactor.

23. The method of claim 14 wherein supplying the gas mixture to the contactor further comprises supplying the gas mixture to a gas inlet of the contactor, wherein the gas inlet comprises an exit orifice within the contactor that is positioned substantially at a mean level of a liquid in the contactor.

* * * * *